US005225871A

United States Patent [19]

Tanimoto

[11] Patent Number: 5,225,871

[45] Date of Patent: Jul. 6, 1993

[54] CONTROL DEVICE FOR IMAGE FORMING EQUIPMENT

[75] Inventor: Yoshiyuki Tanimoto, Tokyo, Japan

[73] Assignee: Ricoh Company, Ltd., Tokyo, Japan

[21] Appl. No.: 897,678

[22] Filed: Jun. 12, 1992

[30] Foreign Application Priority Data

Jun. 12, 1991 [JP] Japan ................................ 3-140202

[51] Int. Cl.[5] ............................................ G03F 15/00

[52] U.S. Cl. .................................... 355/204; 355/285; 364/132

[58] Field of Search ................ 355/204, 207; 364/132; 395/115; 187/101

[56] References Cited

U.S. PATENT DOCUMENTS 4,441,164 4/1984 Pavan et al. ........................ 395/115

4,967,377 10/1990 Masuda ........................... 355/204 Y 5,012,899 5/1991 Iwata .................................. 187/101

*Primary Examiner*—Joan H. Pendegrass

*Attorney, Agent, or Firm*—Mason, Fenwick & Lawrence

[57] ABSTRACT

A control device incorporated in image forming equipment and having at least a main control unit and a slave control unit. The main and slave control units each has a CPU (Central Processing Unit) and a ROM (Read Only Memory) for storing image formation control programs. To change the image formation control programs, only the ROM of the main control unit is replaced to thereby reduce the service time.

5 Claims, 9 Drawing Sheets

CONTROL DEVICE FOR IMAGE FORMING EQUIPMENT

BACKGROUND OF THE INVENTION

The present invention relates to a copier, facsimile transceiver, laser printer or similar image forming equipment and, more particularly, to a control device for such image forming equipment.

It is a common practice with image forming equipment, e.g., a copier to implement a control device as a single control board including a driver and carrying a CPU (Central Processing Unit) thereon. A current trend in the imaging art is toward image forming multifunction equipment and, therefore, toward a control device using a number of CPUs for high-speed processing. Typically, a control device for multifunction equipment is made up of an operating unit for controlling an LCD (Liquid Crystal Display) or similar display and key inputs, a main control unit controlling jam detection and all the peripheral devices and image forming procedure, and a slave control unit for mainly controlling chargers, optics and other image forming devices arranged around a photoconductive element. These three control units have respective CPUs which communicate with one another for controlling the entire equipment.

Specifically, the main control unit has a ROM (Read Only Memory) storing image formation control programs for main control while the slave control unit has a ROM storing image formation control programs for slave control. During image formation, a required control procedure is executed on the basis of the information stored in the ROMs. Necessary data except for the programs are interchanged via interfaces. Image forming equipment of the type including a fixing heater may be operated by a control device in which a plurality of control units have respective CPUs which are capable of communicating with one another.

The programs stored in the ROMs of the control units are not lost even when the power source of the equipment is turned off. However, to change the programs, it is necessary to replace the ROMs. The problem with the conventional control device is that the replacement of the ROM included in the slave control unit is time-consuming since it is positioned at the side or the rear of the equipment. During the replacement of the ROM, the operation of the equipment has to be entirely interrupted, sacrificing the efficiecy.

SUMMARY OF THE INVENTION

It is therefore an object of the present invention to provide a control device which prevents the replacement of a ROM from directly effecting the operation of image forming equipment.

In accordance with the present invention, in a control device incorporated in image forming equipment and comprising at least a main control unit and a slave control unit which have respective CPUs for controlling the entire image forming equipment by communicating with each other, the main control unit comprises a first ROM capable of storing image formation control programs for main control and a second ROM capable of storing image formation control programs for slave control, while the slave control unit comprises a RAM (Random Access Memory) and an information transferring device for transferring the image formation control programs for slave control to the RAM.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
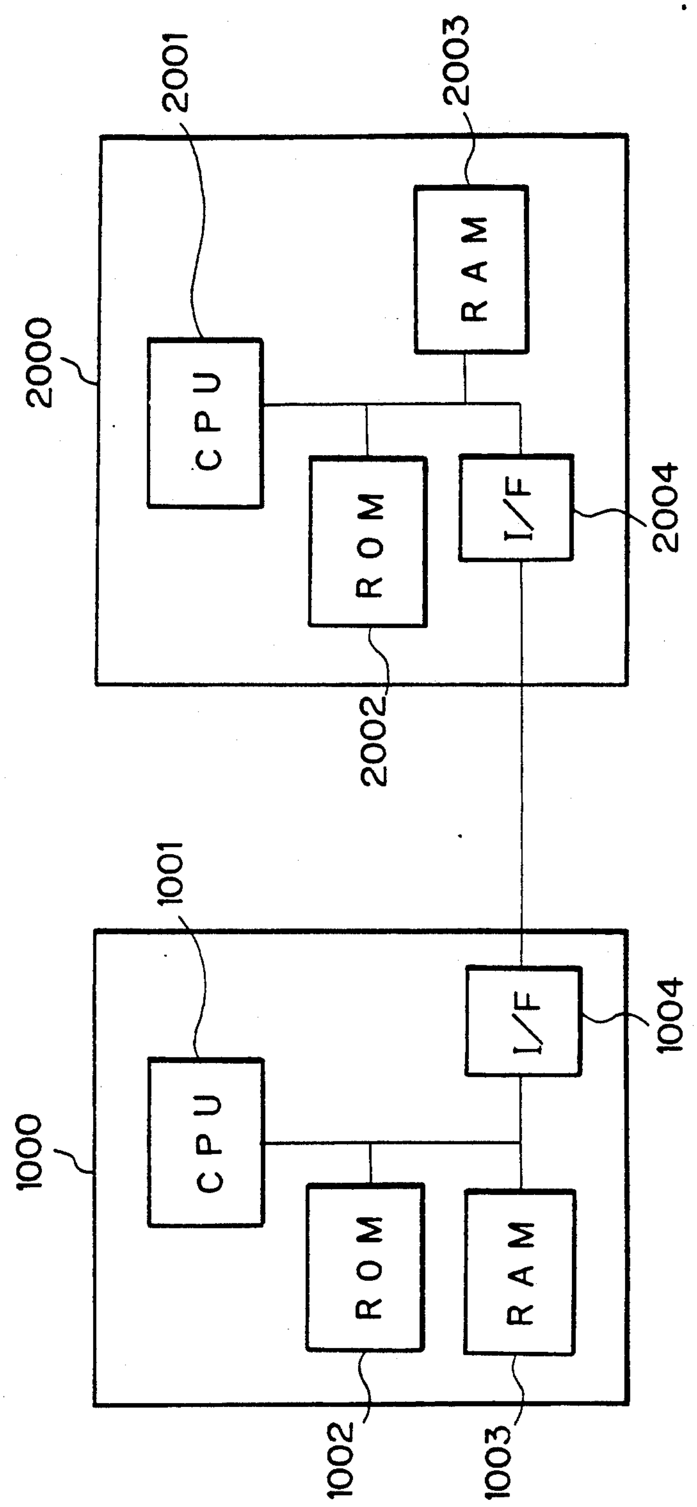
Fig. 1 PRIOR ART
FIG. 1 is a block diagram schematically showing a conventional control device for image forming equipment.

To better understand the present invention, a brief reference will be made to a conventional control device for image forming equipment, shown in FIG. 1. As shown, the control device has a main control unit 1000 and a slave control unit 2000. The main control unit 1000 is made up of a CPU 1001, a ROM 1002, a RAM (Random Access Memory) 1003, and an interface (I/F) 1004. Likewise, the slave control unit 2000 is constituted by a CPU 2001, a ROM 2002, a RAM 2003, and an interface 2004. The ROM 1002 of the main control unit 1000 and the ROM 2002 of the slave control unit 2000 store respectively image formation control programs for main control and image formation control programs for slave control. The image formation control programs for main control include programs relating to the image forming process effected around a photoconductive element. The image formation control programs for slave control include programs relating to magnification change control and paper feed control. In the event of image formation, predetermined control is executed on the basis of information stored in the ROMs 1002 and 2002. The main and slave control units 1000 and 2000 interchange necessary data (except for the programs) via the interfaces 1004 and 2004.

While the programs stored in the ROMs 1002 and 2002 are not lost even when the power source of the equipment is turned off, the ROMs 1002 and 2003 have to be replaced when the programs are to be changed. Since the slave control unit 2000 is, in most cases, located at the side or the rear of the equipment, the ROM 2002 thereof cannot be replaced without resorting to time- and labor-consuming work, i.e., without the image forming operation being interrupted over a substantial period of time. Therefore, with the conventional control device, it is difficult to replace the ROM 2002 of the slave control unit 200 with ease and to achieve the efficient use of the equipment.

Figure 2:
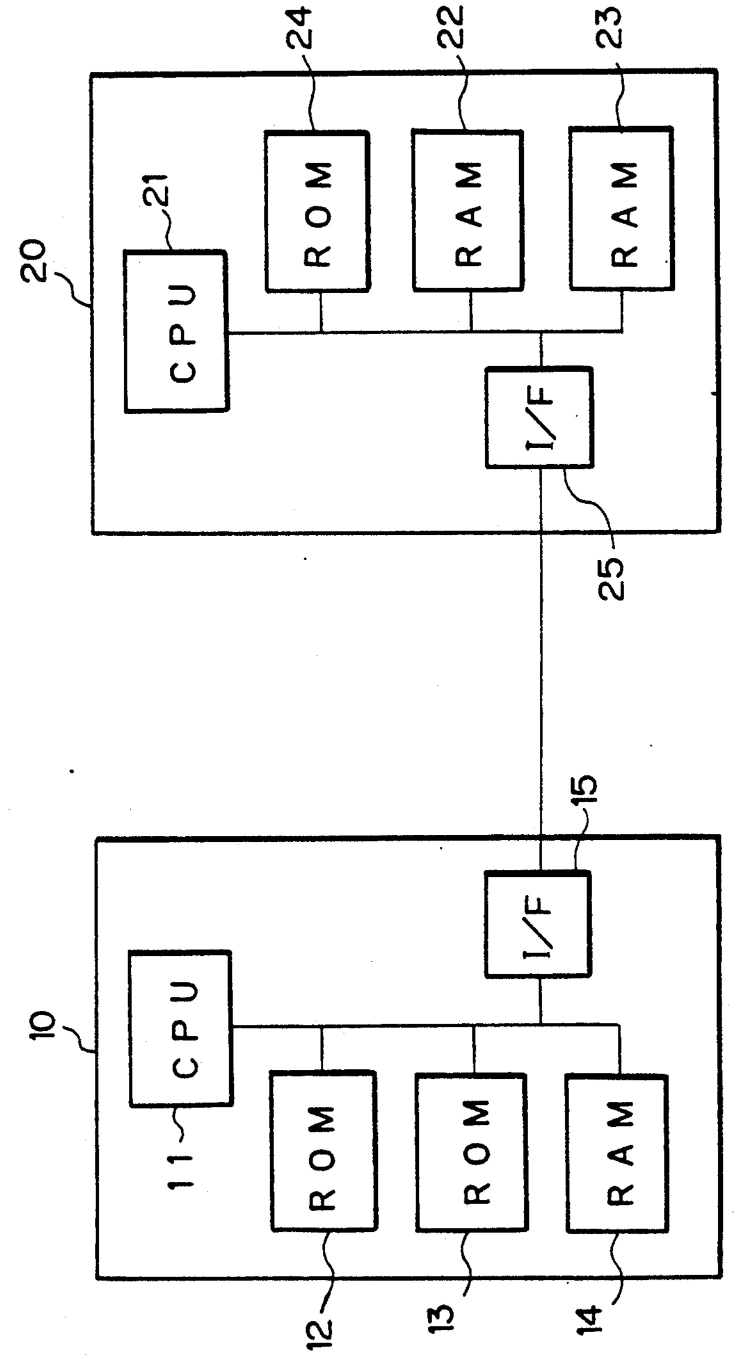
FIG. 2 is a schematic block diagram showing a first embodiment of the control device for image forming equipment in accordance with the present invention.

Referring to FIG. 2, a first embodiment of the control device in accordance with the present invention is shown and generally made up of a main control unit 10 and a slave control unit 20. The main control unit 10 has a CPU 11, a ROM 12 storing image formation control programs for main control, a ROM 13 storing image formation control programs for slave control, a RAM 14, and an interface 15. The slave control unit 20 has a CPU 12, RAMs 22 and 23, a bootstrap ROM 24 playing the role of information transferring means which transfers the programs for slave control to the RAM 23, an interface (I/F) 25. The control units 10 and 20 communicate with each other via the interfaces 15 and 25. the major role of the bootstrap ROM 24 is to initialize main ICs in response to the turn-on of the power source, receive the programs for slave control sent from the main control unit 10 via the interface 25, and store them in the RAM 23. On receiving all the information from the main control unit 10, the bootstrap ROM 24 hands over the execution of the image formation control programs to the programs stored in the RAM 23. Thereafter, the slave control unit 20 operates with the RAM 23.

As stated above, since the bootstrap ROM 24 is not related to the control programs of image forming equipment, it does not have to be changed. Specifically, the programs can be changed only if the ROMs 12 and 13 of the main control unit 10 are replaced. More specifically, the serviceman should only change the ROMs 12 and 13 of the main control unit 10, whereby the service time is noticeably reduced. The slave control unit 20 can be located even at a position which is not easy to access since it does not have to have the ROM 24 thereof replaced, enhancing the freedom of layout. Further, the number of ROMs to be replaced is reduced, reducing the cost and eliminating various accidents.

Figure 3:
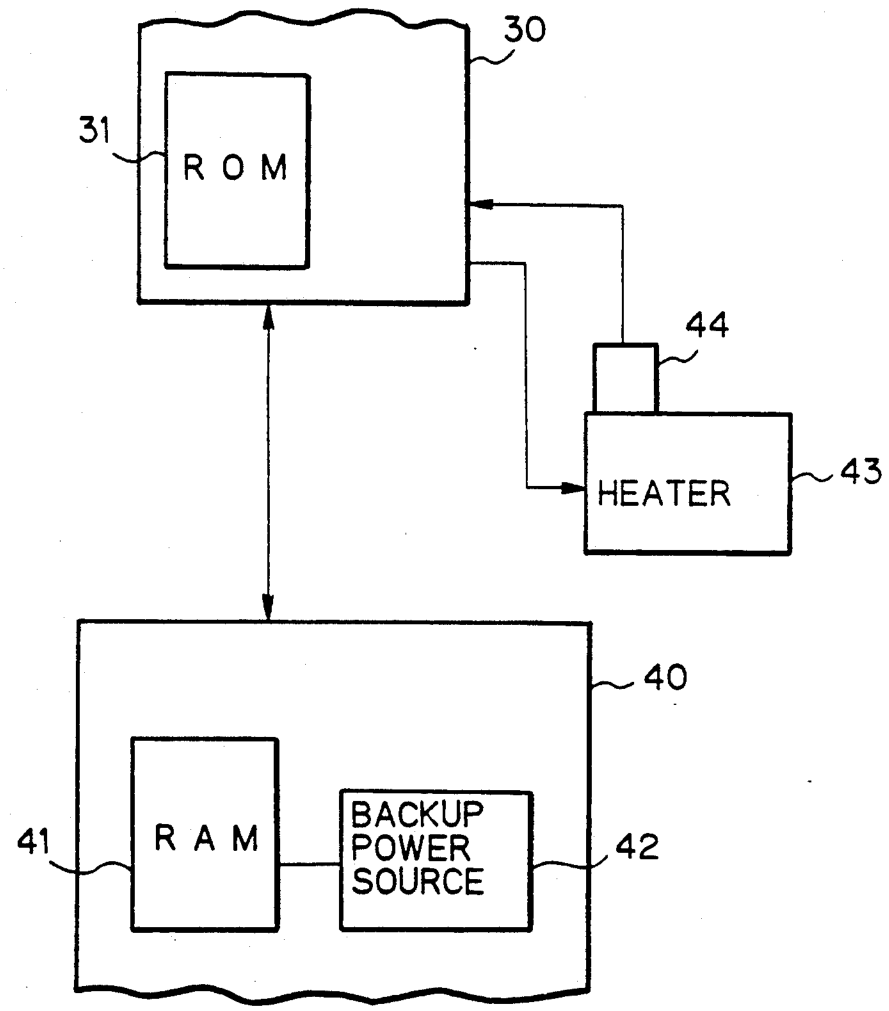
FIG. 3 is a schematic block diagram showing a second embodiment of the present invention.

FIG. 3 shows a second embodiment of the present invention. As shown, the control device has a main control unit 30 and a slave control unit 40. The main control unit 30 has a ROM 31 storing image formation control programs for main and slave control. The slave control unit 40 has a RAM 41, a bootstrap RAM, not shown, for transferring the programs for slave control stored in the ROM 31 to the RAM 41, and a backup power source 42 for backing up the RAM 41. A temperature sensor 44 is associated with a fixing heater 43 and has the output thereof connected to the main control unit 30. When a main switch, not shown, is turned on, the temperature of the fixing heater is controlled such that the temperature of a fixing roller, not shown, remains in a predetermined range. The main control unit 20 and slave control unit 40 interchange data with each other via respective interfaces, not shown.

Figure 4:
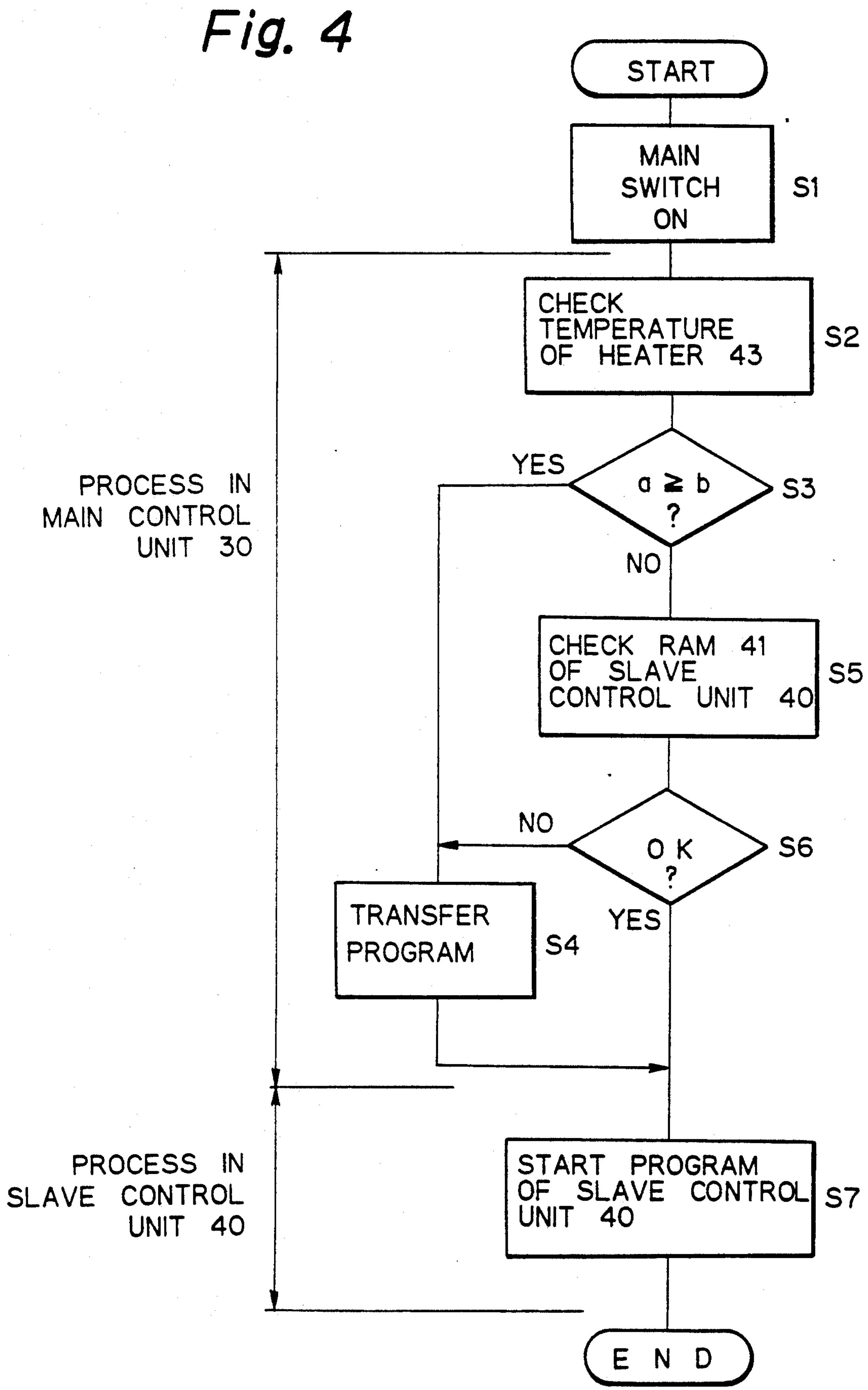
FIG. 4 is a flowchart demonstrating a specific operation of the second embodiment.

A reference will be made to FIG. 4 for describing a specific procedure beginning with the turn-on of the main switch and ending with the program control of the slave control unit 40. As shown, when the main switch of the image forming equipment is turned on (step S1), the main control unit 30 measures the temperature of the fixing heater 43 in response to the output of the temperature sensor 44 and thereby calculates a rise time a of the heater 43 (S2). At a step S3, the main control unit 30 compares the rise time a with a transfer time b necessary for the image formation control programs to be sent from the main control unit 30 to the slave control unit 40. Here, the transfer time b is a constant particular to the equipment. If the rise time a is equal to or longer than the transfer time b (YES, S3), meaning that the transfer time b will expire before the rise time a, the programs for slave control are transferred from the main control unit 30 to the slave control unit 40 (S4). Assume that the main switch is turned off and then immediately turned on again. Then, the temperature of the fixing heater 43 will not have lowered much, and the programs for slave control remain in the RAM 41 due to the backup power source 42. In such a case, since the transfer time b is considered to be longer than the rise time b (NO, S3), the main control unit 30 sends a command to the slave control unit 40 for causing it to check the RAM 41 (S5 and S6). On receiving a positive answer informing that the programs remain in the RAM 41 from the slave control unit 40, the main control unit 30 causes the slave control unit 40 to execute the programs. If the answer of the step S6 is negative, NO, the main control unit 30 sends the control programs to the RAM 41 of the slave control unit 40. In practice, the result of decision at the step S6 will be scarcely negative.

In this embodiment, since the transfer time absorbs the rise time, it does not limit the usability of the equipment at all and, therefore, does not increase the operator's waiting time.

Figure 5:
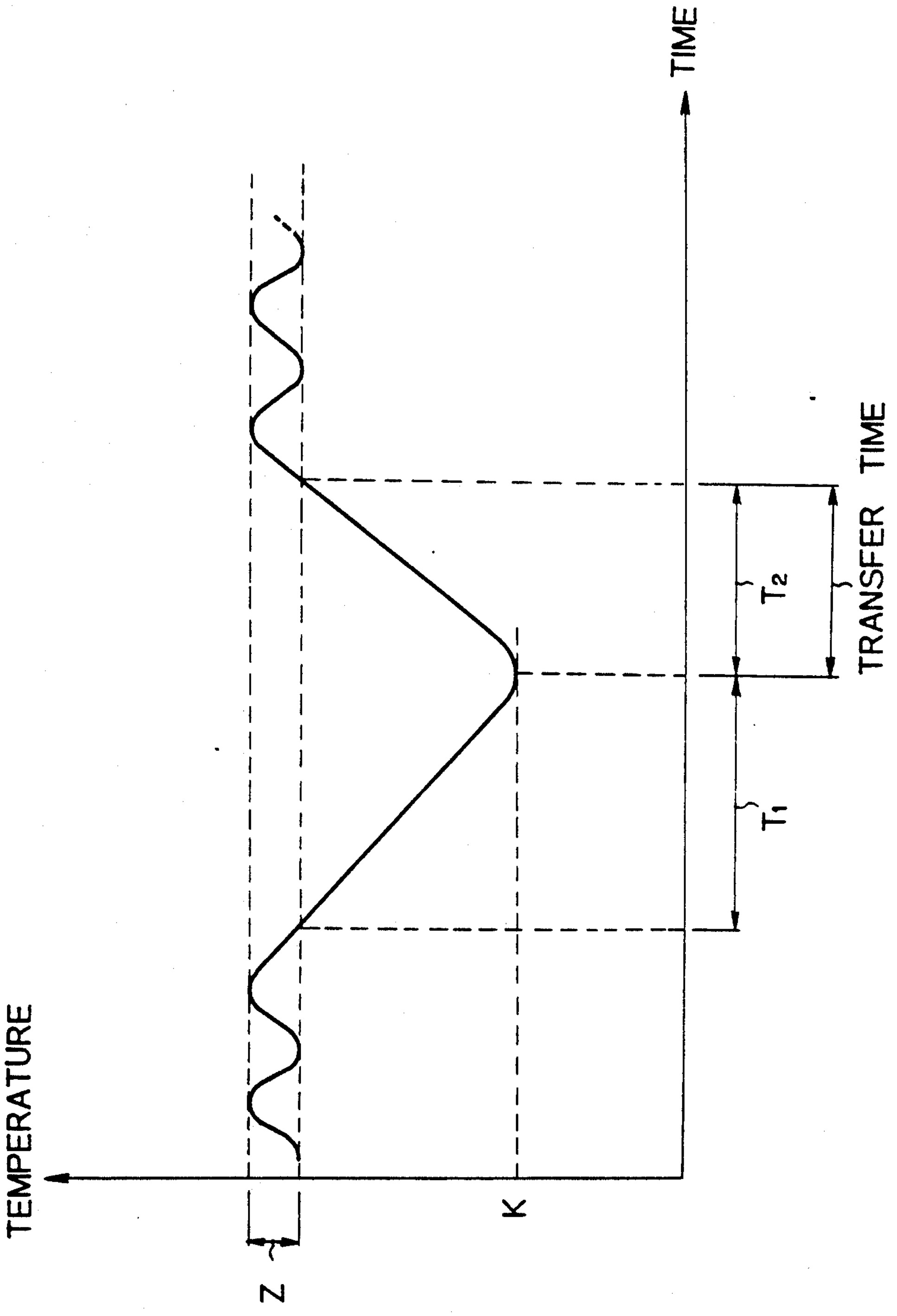
FIG. 5 is a graph indicative of the variation of the temperature of a fixing heater on which a third embodiment of the present invention is based.

A third embodiment of the present invention which is concerned with the minimum capacity of the backup power source 42 will be described. Specifically, as shown in FIG. 5, when the main switch of the image forming equipment is turned on, the fixing heater 43 is held in a predetermined adequate temperature range Z. As the main switch is turnd off, the temperature of the fixing heater 43 sequentially falls from the adequate range Z due to natural cooling and reaches a certain low temperature K on the elapse of a period of time T1. Thereafter, when the main switch is turned on again, the temperature of the fixing heater 43 begins to rise from the temperature K and reaches the adequate range Z on the elapse of a period of time T2. The periods of time T1 and T2 tend to increase with the decrease in the temperature K. However, considering the temperature K of interest as a mean of ambient temperatures of the equipment, the periods of time T1 and T2 may be regarded as fixed values. The period of time T2 corresponds to the previously mentioned rise time a, and the transfer time b is a constant particular to the equipment, as stated earlier. Hence, the conditions of the fixing heater 43 and RAM 41 are so selected as to set up a relation $a=b=T2$.

Only if the backup power source 42 maintains the information in the RAM 41 over the period of time T1, the rise time a will absorb the transfer time b or the information will remain in the RAM 41. This is true with no regard to the time when the main switch is to be turned on and except for some unusual cases wherein the ambient temperature changes beyond an ordinary range. The backup power source 42, therefore, should only be provided with a minimum capacity capable of holding the information just over the period of time T1. Further, the backup power source 42 can be implemented as a backup capacitor which is far inexpensive than a lithium battery, nickel-cadmium battery or similar battery which is expensive and needs a complicated power source switching circuit.

Figure 6:
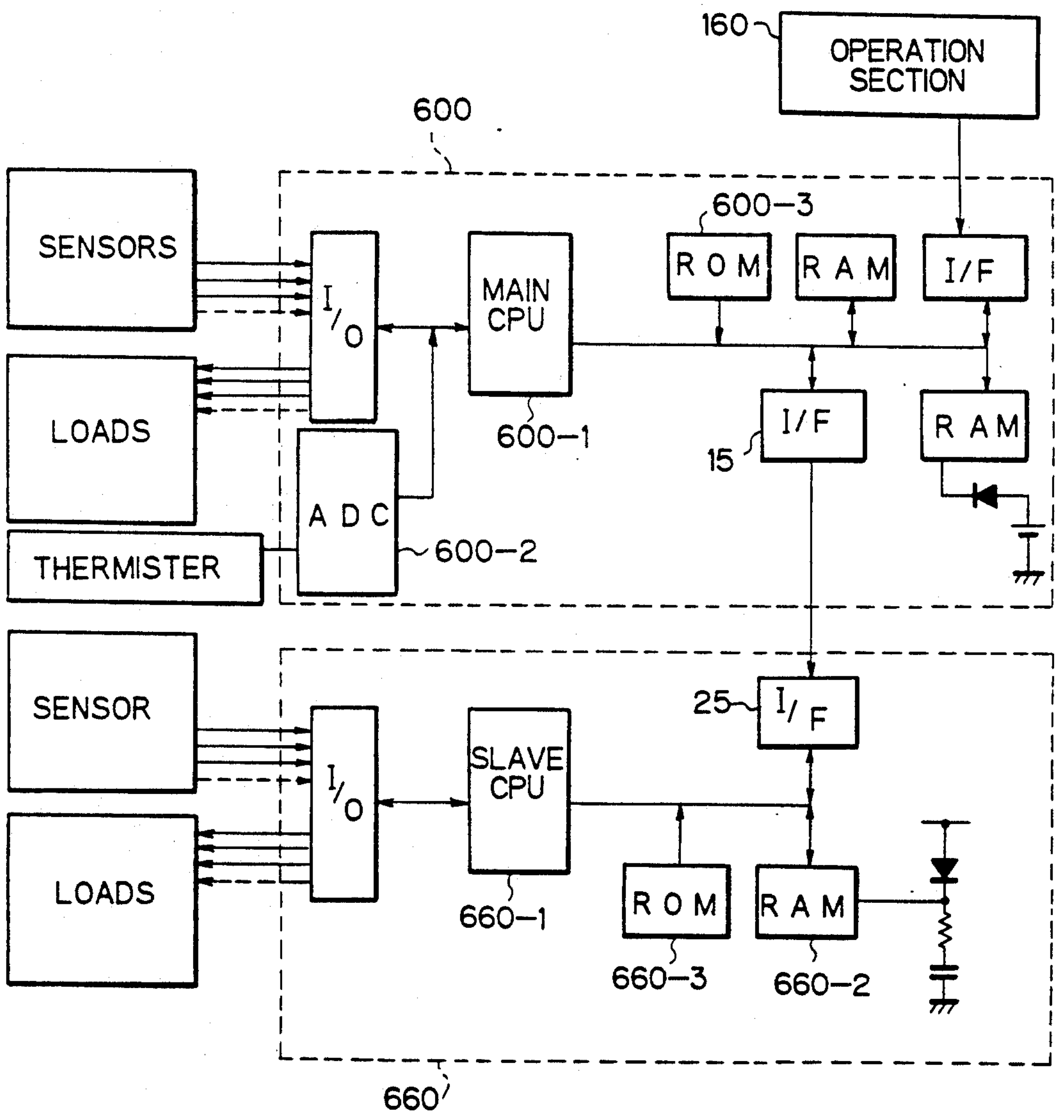
FIG. 6 is a block diagram schematically showing a fourth embodiment of the present invention.

Referring to FIG. 6, a fourth embodiment of the present invention will be described which is a modified form of the third embodiment. As shown, the control device includes a main control unit 600 having a main CPU 600-1. A thermistor is held in pressing contact with a fixing roller, not shown. On the turn-on of a main switch, not shown, the main CPU 600-1 receives the output of the thermistor via an analog-to-digital converter (ADC) 600-2. The CPU 600-1 performs a backward calculation with the digital input to determine a rise time of fixation, and compares it with a program transfer time. If the rise time is longer than the program transfer time, the CPU 600-1 sends the programs from a ROM 600-3 thereof to a slave control unit 660 via interfaces 15 and 25. A slave CPU 660-1 is included in the slave control unit 660 and stores the data sent from the main control unit 600 in a RAM 660-2. On storing all the data in the RAM 660-2, the slave CPU 660-1 executes the programs stored in the RAM 660-2. This part of the procedure occurs within the rise time of the fixing heater and, therefore, does not increase the operator's waiting time. If the program transfer time is longer than the rise time, the main control unit 600 sends a command to the slave control unit 660 to check the RAM 660-2. On receiving such a command, the slave control unit 660 checks the RAM 660-2 to see if the programs from the main control unit 600 are correctly stored. If the programs are correctly stored, the slave control unit 660 returns an OK answer to the main control unit 600. If the data and, therefore, the programs are not correct, the slave control unit 660 returns an NG answer to the main control unit 600 to thereby request the control unit 600 to send the programs.

A ROM 660-3 is also included in the slave control unit 660 and stores programs for the above data transfer and program checking. The slave CPU 660-1 executes the programs relating to the copying operation and stored in the RAM 660-2. Here, the ROM 660-3 plays the role of an exclusive bootstrap ROM for the rising stage. The RAM 660-2 is backed up by a capacitor, as illustrated. Hence, the data stored in the RAM 660-2 will not be lost for a short period of time even when the main switch is turned off. The capacitor needs only a capacity sufficient to hold the data for the period of time T1 in which the fixing heater is cooled off to the temperature K at which the transfer time and the rise time are equal. Hence, the capacitor eliminates the need for a lithium battery or a nickel-cadmium battery. Specifically, when the main switch is turned on for the first time in the morning, all the image formation control programs are sent from the main control unit 600 to the slave control unit 660. Then, even if the main switch is turned off and then turned on again at a short interval, the equipment is ready to operate; if it is turned on the elapse of a substantial period of time, the programs are again sent to the slave control unit 660 within the rise time of the fixing heater. This is successful in preventing the operator from waiting for a long period of time.

The RAM 660-2 can be checked by the interchange of only several bytes, i.e., within 1 second. If the programs stored in the slave control unit 660 are defective for some reason in the event when the RAM 660-2 is to be be checked, the embodiment will request the operator to wait until the program transfer time expires. In certain image forming equipment, the rise time of the fixing heater is 7 minutes when the room temperature is 0 degrees to 25 degrees. Assuming that the interfaces 15 and 25 are each implemented by RS-232C and that 513 kilobytes of programs are transferred at 19200 baud, then the transfer time is approximately 3 minutes and 30 seconds.

Figure 7:
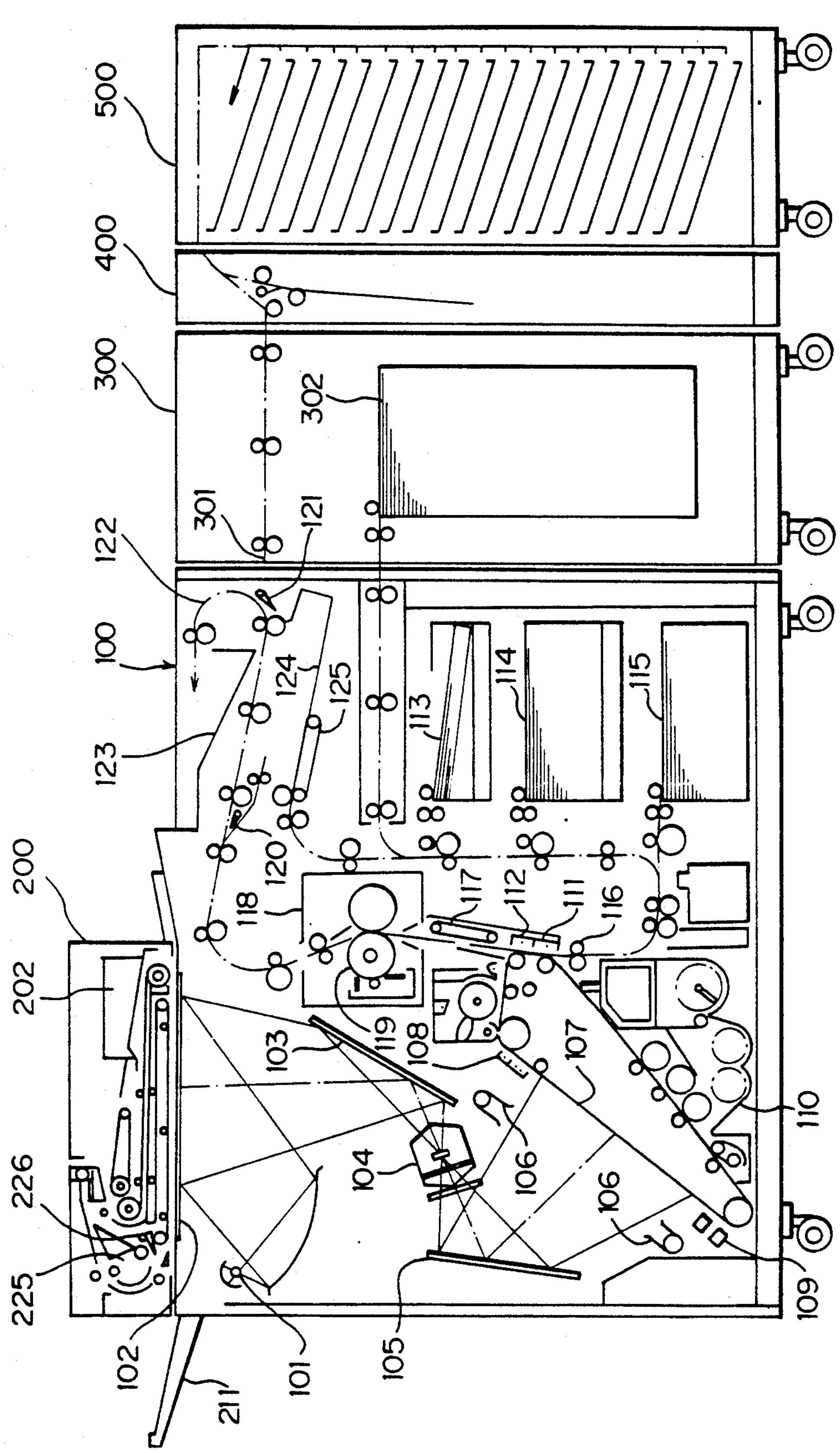
FIG. 7 is a section showing a specific construction of image forming equipment to which the embodiments are applicable.

A specific construction of image forming equipment to which the embodiments of the invention are applicable is shown in FIG. 7. As shown, a recycling document feeder (RDF) is mounted on the top of the equipment body 100 for feeding a document, not shown, to a glass platen 102. After the document has located at a predetermined position on the glass platen 102, it is illuminated by a flash lamp 101. The resulting reflection from the document is routed through a first mirror 103, a through lens 104 and a second mirror 105 to a photoconductive element implemented as a belt 107. A restricting member 106 is so located as to limit the range over which the belt 107 is to be exposed. The surface of the belt 107 is uniformly charged by a main charger 108, so that the reflection from the document electrostatically forms a latent image thereon. After an eraser 109 has erased the belt 107 except for the image area, a developing unit 110 develops the latent image by a toner. The resulting toner image is transferred to a paper sheet or similar recording medium which is fed from any one of a paper cassette 113 and paper trays 114 and 115 mounted on the equipment body 100, and a large capacity tray (LCT) 302 operatively connected to the side of the equipment body 100. Specifically, the paper sheet is driven by a register roller 116 toward the belt 107 at such a timing that a predetermined transfer area thereof accommodates the toner image formed on the belt 107. A separation charger 112 separates the paper sheet carrying the toner image thereon from the belt 107. The paper sheet so separated from the belt 107 is conveyed by a transport belt 117 to a fixing unit 118. In the fixing unit 118, a fixing roller, not shown, fixes the toner image on the paper sheet.

A pawl 119 is incorporated in the fixing unit 118 and faces the periphery of the fixing roller, not shown. The pawl 119 steers the paper sheet with the toner image to the outside of the fixing unit 118. The paper sheet come out of the fixing unit 118 is transported along a particular path depending on the operation modes of the equipment. i.e., an ordinary discharge mode or a sort mode and a one-sided copy mode or a two-sided copy mode. When the ordinary discharge mode and one-sided copy mode are set up, the paper sheet from the fixing unit 118 is caused to advance straight by a pawl 120 and thereby prevented from approaching a two-sided copy tray 124. Then, this paper sheet is further steered by a pawl 121 toward a turning section 122. As a result, the paper sheet is driven out of the equipment body 100 to a tray 123. The turning section 122 turns over the paper sheet, so that the paper sheet is stacked on the tray 123 face down. On the other hand, when the sort mode and one-sided copy mode are selected, after the paper sheet has advanced straight as stated above, it is further driven by the pawl 121 straight away from the turning section 122. Consequently, this paper sheet is introduced into the LCT 300 via an inlet 301 formed through the latter and then into a reversing device 400 which adjoins the LCT 300. After the paper sheet has been turned over by the reversing device 400, it is distributed to one of the bins arranged in a sorter 500.

Assume that the ordinary discharge mode or the sort mode is selected in combination with the two-sided copy mode. Then, the paper sheet coming out of the fixing unit 118 is steered toward the two-sided copy tray 124 by the pawl 120 to be stacked on the tray 124 for a moment. After such one-sided paper sheets have been stacked on the tray 124, they are sequentially refed from the tray 124 by a belt 125, the lowermost one being first. On reaching the same transport path as during the one-side copying, the paper sheet is again driven toward the belt 107 by the register roller 116. While the paper sheet is transported with the rear thereof facing the belt 107, an image of another document or an image present on the rear of the same document is transferred to the rear of the paper sheet. Thereafter, the paper sheet is again routed through the fixing unit 118 to either of the tray 123 mounted on the copier body 100 and the sorter 500.

On the other hand, the RDF 200 is operated in a manner matching the copy mode, as follows. In the specific construction, the RDF 200 has document feeding means which is selectively driven in an SDF mode or an RDF mode which is conventional. The RDF 200 includes a document tray 202, a reversing section 225, and a discharge tray 211. In FIG. 7, when the SDF mode is selected, a stack of documents are set on the document tray 202 of the equipment body 100 face down, and each is transported from the right to the left of the lower portion of the RDF 200 along the glass platen 102. By contrast, when the RDF mode and one-sided copy mode are selected, the documents set on the document tray 202 are sequentially fed from the right to the left along the glass platen 102. After the document has been brought to a stop in the predetermined position on the glass platen 102, it is illuminated over the entire surface thereof. The document undergone illumination is switched back by the reversing section 225 and then returned to the document tray 202 with the copied surface thereof facing downward. Further, when the RDF mode and two-sided copy mode are selected, documents are stacked on the document tray 202 with the surfaces thereof to be reproduced facing downward and then sequentially transported from the right to the left to the glass platen 102. As soon as the document has been brought to a stop on the glass platen 102, the surface thereof facing downward, i.e., the front is illuminated over the entire area. This document is switched back by the reversing section 225 and then returned by a pawl 226 toward the predetermined position on the glass platen 102. Then. the rear of the document is illuminated in the same manner as the front. The document having both sides thereof illuminated is returned to the document tray 202 via the reversing section 225.

Figure 8A:
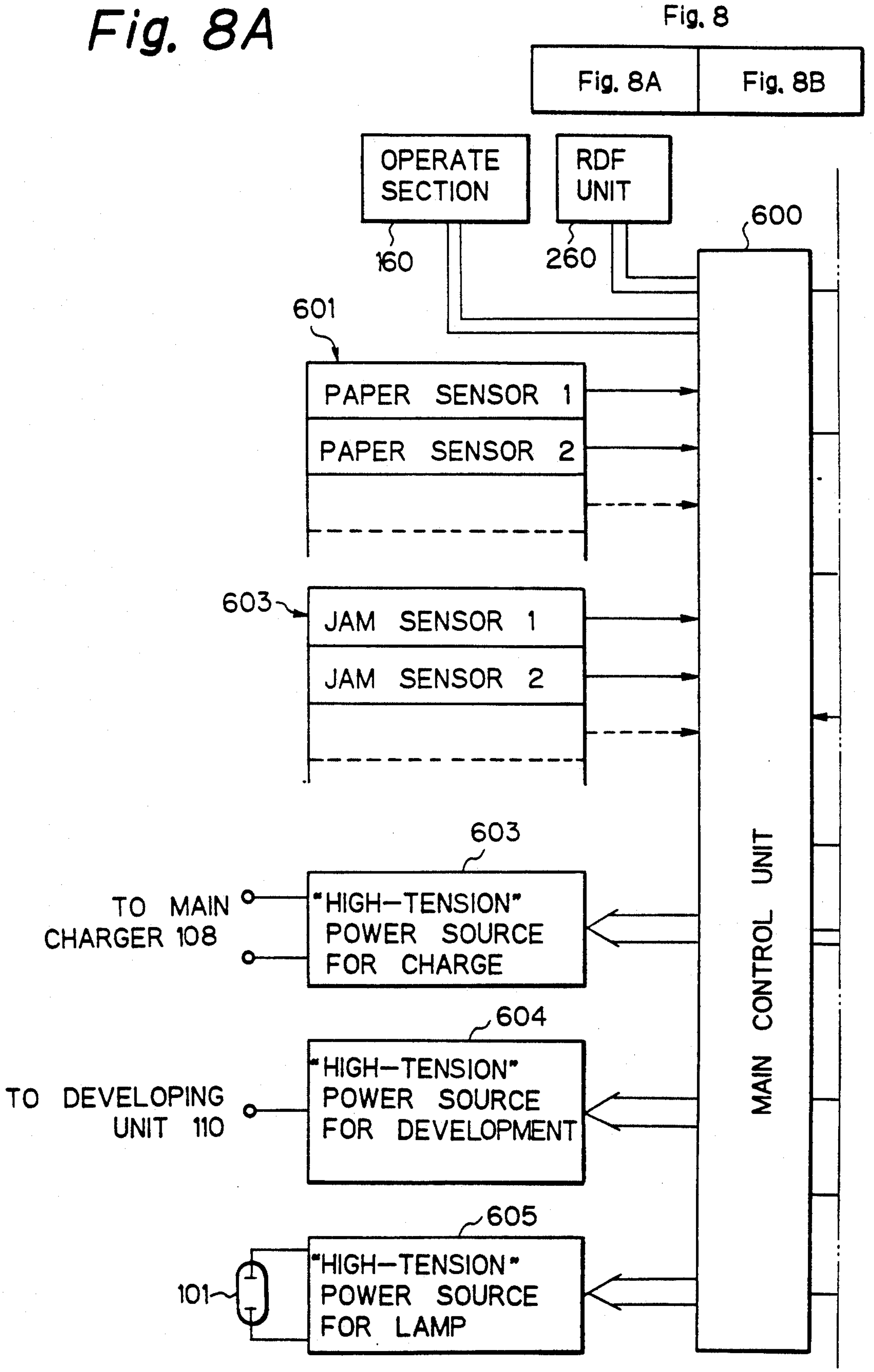
FIG. 8 is a schematic block diagram showing a control system incorporated in the equipment shown in FIG. 7.
Figure 8B:
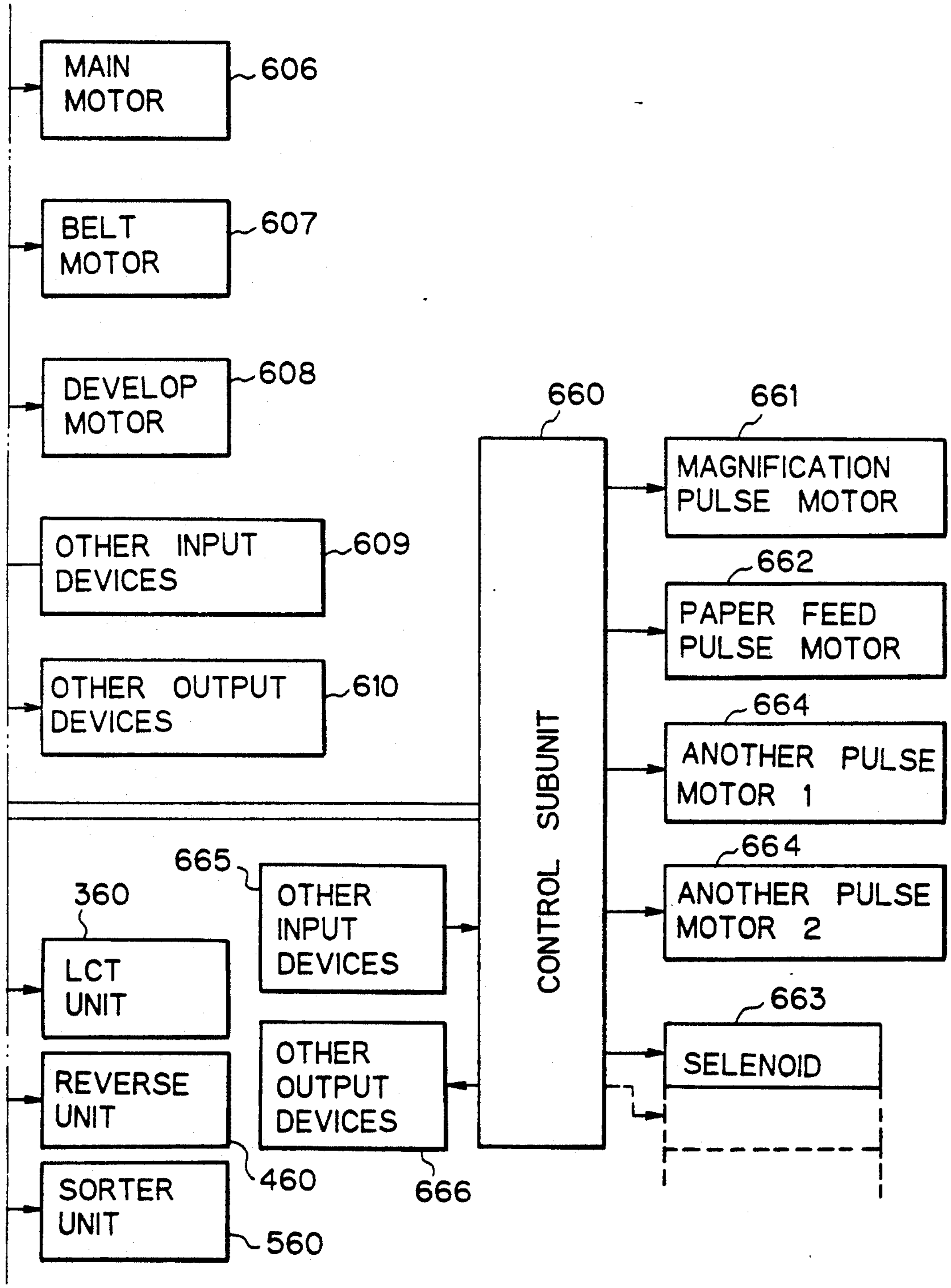

FIG. 8 shows a control device for controlling the feed and transport of a paper sheet, the formation of an image on the paper sheet, and the feed and transport of a document to occur in the equipment shown in FIG. 7. Specifically, FIG. 8 shows the objects to be controlled by the control units of FIG. 6 in a specific form in relation to the equipment of FIG. 7. As shown, a main control unit 600 includes a CPU, not shown. Connected to the input ports and output ports of the main control unit 600 are sensors including a paper sensor 601 and a jam sensor 602, a high-tension power source 603 for applying a voltage to the main charger 108, a high-tension power source 604 for applying a bias for development to the developing unit 101, a high-tension power source 605 for applying a voltage to the flash lamp 101, a main motor 606 for mainly driving the paper transport system, a belt motor 607 for driving the photoconductive belt 107, a motor 608 for driving the developing unit 110, an operating section 160 accessible for selecting the drive conditions of the equipment body 110 (copy modes, density and so forth), an RDF unit 260 for driving the RDF 200, an LCT unit 360 for driving the LCT 300, a reversing unit 460 for driving the reversing device 400, a sorter unit 560 for driving the sorter 500, a control subunit 660, other input devices 609, and other output devices 610.

The main control unit 600, operating section 160 and RDF unit 260 are capable of interchanging commands by serial communication over optical fibers. A CPU, not shown, is also mounted on the control subunit 660 which mainly controls a pulse motor system. The control subunit 660 is capable of serially communicating with the main control unit 600 over an optical fiber. Connected to the control subunit 660 are a pulse motor 661 for driving the through lens 104 in the event of changing the magnification, a pulse motor 662 for driving the paper feed system, solenoids 663 for driving the pawls 120 and 121, other pulse motors 664, other input devices 665, and other output devices 666.

In summary, it will be seen that the present invention provides a control device which frees image forming equipment from the direct influence of the period of time necessary for a ROM to be replaced, thereby promoting the efficient operation of the equipment.

Various modifications will become possible for those skilled in the art after receiving the teachings of the present disclosure without departing from the scope thereof.

What is claimed is:

1. A control device for use in image forming equipment, the control device comprising:

a) a main control unit having a main control unit CPU for communicating with a slave control unit CPU so that the main control unit CPU and slave control unit control the entire image forming equipment, the main control unit including:
 1) a first ROM means for storing image formation control programs for main control; and
 2) a second ROM means for storing image formation control programs for slave control; and
b) a slave control unit having the slave control unit CPU for communicating with a main control unit CPU so that the main control unit CPU and slave control unit control the entire image forming equipment, the slave control unit including:
 1) a RAM; and
 2) information transferring means for transferring the image formation control programs for slave control to the RAM, wherein, when the image forming equipment has a fixing heater, the information transferring means constitutes means for transferring the image formation control programs for slave control using a rise time particular to the fixing heater.

2. The control device of claim 1, wherein:

the information transferring means includes a bootstrap ROM.

3. The control device of claim 1, wherein:

the image formation control programs for slave control are transferred only if control programs are absent in the RAM as determined by checking the slave control unit on turn-on of a main switch provided on the image forming equipment.

4. The control device of claim 1, wherein:

if temperature of the fixing heater is lowered due to a turn-off of a main switch of the image forming equipment and is then elevated to an adequate fixing temperature due to a turn-on of the main switch, the main switch is turned on to cause transfer of the image formation control programs for slave control at a particular time when the fixing heater is cooled to a level which makes a period of time necessary for the temperature of the fixing heater to rise to the adequate fixing temperature longer than a period of time necessary for the control programs to be transferred.

5. The control device of claim 1, wherein:

the slave control unit further includes a backup power source; and if the temperature of the fixing heater is lowered from a predetermined adequate fixing temperature to a certain temperature in a first period of time due to a turn-off of a main switch and then is elevated from the certain temperature to the predetermined adequate fixing temperature due to a turn-on of the main switch, and if the image formation control programs for slave control are transferred on a turn-on of the main switch occurring at a particular time when the fixing heater is cooled to a level which equalizes a second period of time necessary for the temperature to rise from the certain temperature to the predetermined adequate fixing temperature and a period of time necessary for the control programs to be transferred, the backup power source is provided with a minimum capacity allowing the temperature of the fixing heater to fall from the predetermined adequate fixing temperature to the certain temperature in the first period of time.

* * * * *